(12) United States Patent
Beauvais et al.

(10) Patent No.: US 6,514,877 B1
(45) Date of Patent: Feb. 4, 2003

(54) METHOD USING SUB-MICRON SILICIDE STRUCTURES FORMED BY DIRECT-WRITE ELECTRON BEAM LITHOGRAPHY FOR FABRICATING MASKS FOR EXTREME ULTRA-VIOLET AND DEEP ULTRA-VIOLET LITHOGRAPHY

(75) Inventors: Jacques Beauvais, Sherbrooke (CA); Dominique Drouin, Deauville (CA); Eric Lavallee, Sherbrooke (CA)

(73) Assignee: Universite de Sherbrooke, Quebec (CA)

( * ) Notice: Subject to any disclaimer, the term of this patent is extended or adjusted under 35 U.S.C. 154(b) by 0 days.

(21) Appl. No.: 09/697,403

(22) Filed: Oct. 27, 2000

(30) Foreign Application Priority Data

Oct. 27, 1999 (CA) .............................................. 2287671

(51) Int. Cl.[7] .............................................. H01L 21/31
(52) U.S. Cl. .......................... 438/763; 430/8; 427/495
(58) Field of Search ............................... 438/660, 763; 430/5; 427/495; 117/8

(56) References Cited

U.S. PATENT DOCUMENTS

| | | | |
|---|---|---|---|
| 5,075,243 A | * 12/1991 | Nieh et al. ..................... 117/8 |
| 5,750,290 A | * 5/1998 | Yasuzato et al. ............ 430/322 |
| 5,918,143 A | 6/1999 | Beauvais et al. ........... 438/607 |
| 6,261,938 B1 | * 7/2001 | Beauvais et al. ........... 438/607 |

FOREIGN PATENT DOCUMENTS

WO          WO 00/17710          3/2000

OTHER PUBLICATIONS

"Potentials And Challenges For Lithography Beyond 193 nm Optics", J. Canning, J. Vac. Sci. Technol. B 15(6), 1997.
"Spatial Frequency Analysis Of Optical Lithography Resolution Enhancement Techniques", Brueck et al., J. Vac. Sci. Technol. B 17(3), 1999.

(List continued on next page.)

*Primary Examiner*—Wael Fahmy, Jr.
*Assistant Examiner*—William David Coleman
(74) *Attorney, Agent, or Firm*—Perman & Green, LLP

(57) ABSTRACT

To fabricate masks for deep ultra-violet lithography and for extreme ultra-violet lithography, a layer of material opaque to deep ultra-violet radiation and an extreme ultra-violet radiation absorbent layer are each deposited successively with a layer of silicon and a layer of metal on a respective transparent substrate. A focused electron beam is displaced on the superposed layers of metal and silicon to form a structure of etch-resistant metal/silicon compound. The deep ultra-violet mask is then formed by etching the three layers to leave on the substrate, the metal/silicon compound structure with the extreme ultra-violet absorbent layer beneath it. The extreme ultra-violet mask is fabricated by forming the absorbent layer successively of an etch-stop sublayer, a repair buffer sublayer, and a sublayer of extreme ultra-violet radiation absorbent material, which, after etching, leaves on the substrate, the metal/silicon compound structure with the extreme ultra-violet radiation absorbent sub-layer and the repair buffer sublayer beneath it.

3 Claims, 4 Drawing Sheets

OTHER PUBLICATIONS

"Extreme Ultraviolet Lithography", Gwyn et al., J. Vac. Sci. Technol. B 16(6), 1998; "EUV Mask Patterning And Printability Studies with a Ta–Based Absorber", Mangat et al., (Abstract).

"Activation Energy For $Pt_2Si$ and PtSi Formation Measured Over A Wide Range Of Ramp Rates", E. Colgan, J. Mater. Res., vol. 10, No. 8, 1995.

"Resist Heating In High Speed Electron Beam Pattern Generators", Ralph et al., Proceedings, The Electrochemical Society, Symposium on Electron and Ion Beam Science And Technology, $10^{th}$ International Conference, 1983.

"Resist Heating Effect In Electron Beam Lithography", Yasuda et al., J. Vac. Sci. Technol. B 12(3), 1994.

* cited by examiner

Figure 1
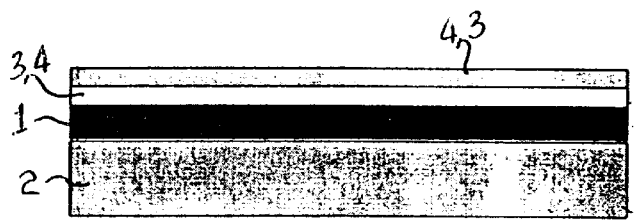
Figure 1a
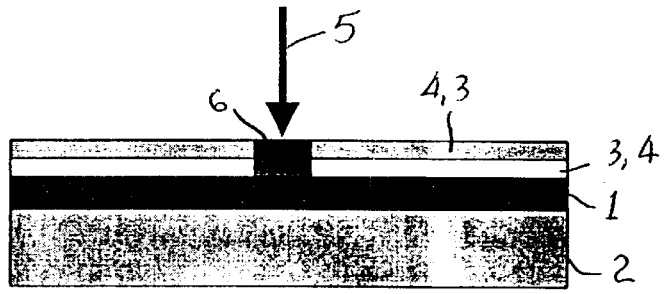
Figure 1b
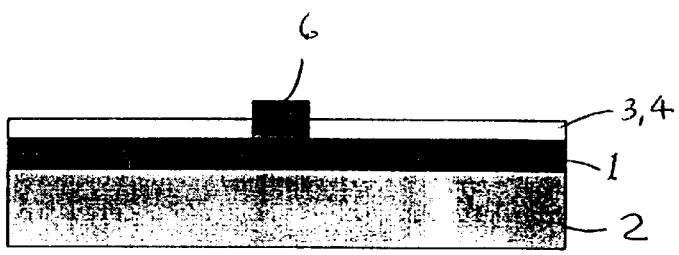
Figure 1c
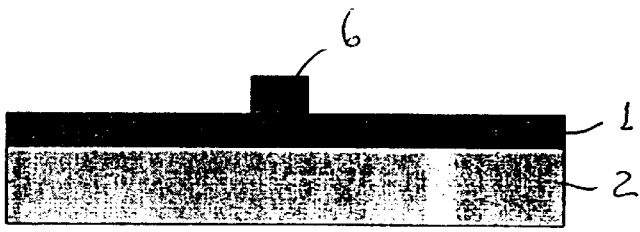
Figure 1d
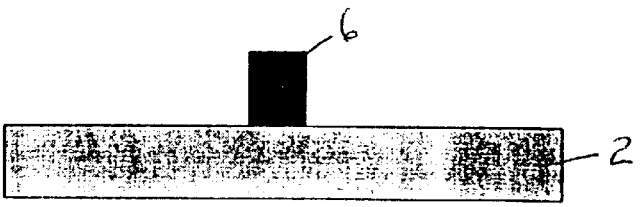
Figure 1e

METHOD USING SUB-MICRON SILICIDE STRUCTURES FORMED BY DIRECT-WRITE ELECTRON BEAM LITHOGRAPHY FOR FABRICATING MASKS FOR EXTREME ULTRA-VIOLET AND DEEP ULTRA-VIOLET LITHOGRAPHY

BACKGROUND OF THE INVENTION

1. Field of the Invention

The present invention relates to a method of fabricating masks for extreme ultra-violet and deep ultra-violet lithography using structures of etch-resistant metal/semiconductor compound formed by a direct-write electron beam lithography process.

2. Brief Description of the Prior Art

The fabrication of very large scale integrated circuits combined with the miniaturization of electronic devices requires several improvements of the lithography techniques that are already used for industrial production. Deep ultra-violet (DUV) lithography is the technique used in large scale production of devices and circuits, using light sources with 248, 193 and 157 nm wavelengths [J. Canning (1997), J. Vac. Sci. Technol., B15, 2109]. The fabrication of devices with a resolution of the order of these wavelengths is limited by these wavelengths. To solve these problems, several approaches are evaluated. One of these approaches is to introduce correction patterns in the exposed mask patterns in order to compensate for the deformation induced by the UV limitations at these wavelengths [S. R. J. Brueck, Xiaolan Chen, (1999), J. Vac. Sci. Technol., B17, 908]. These corrections patterns, often referred to as optical proximity correction (OPC), and the fabrication of masks for high resolution purposes (with or without proximity corrections) requires the use of a high resolution electron beam lithography technique. Current techniques use polymeric or organic resist as the electron sensitive material, which are often limited in achievable resolution and have a poor resistance to chemical etching used afterward to transfer the pattern from the exposed resist to the mask itself. Also, polymeric or organic resists must be spin-coated, a process that causes undesirable particles to be included in the resist layer. These particles in turn cause defects in the exposed patterns, which are detrimental to the process.

Another approach is to reduce the wavelength of the emitted UV light. This approach requires reflective optical elements for wavelengths of the order of 10 nm (Extreme Ultra-Violet or EUV) [C. W. Gwyn, R. Stulen, D. Sweeney, D. Attwood, (1998), J. Vac. Sci. Technol., B16, 3142]. One element is the reflective mask, which is made of absorbent regions on a reflective multi-layer system [P. J. S. Mangat et al. (1999), The 43rd International Conference on Electron, Ion and Photon Beam Technology and Nanofabrication, Abstracts of conference, 456]. The resolution required in the fabrication of these masks is less important since no optical proximity correction is needed at these wavelengths. However, the absorbent layer must be thick enough for it to absorb over 90% of EUV light. This requires metallic layers with a thickness of the order of 100 nm. In the patterning process for these structures, electron-beam lithography is often used. However, the poor resistance of electron-sensitive resists implies the use of thick resist layers which reduces the achievable resolution. Also, the problems caused by the spin-coating of polymeric or organic resists are also a concern in the fabrication of masks for EUV lithography.

In 1997 and 1998, a resistless sub-micron lithography technique using the electron beam energy to form silicide was discovered [U.S. Pat. No. 5,918,143 granted to Beauvais et al. for "Fabrication of sub-micron silicide structures on silicon using resistless electron beam lithography"] and its application to the fabrication of masks for X-ray lithography and nano-imprint lithography were demonstrated. This technique eliminates the need for polymeric or organic resists and solves several problems associated with electron beam lithography.

OBJECT OF THE INVENTION

An object of the present invention is to use electron beam lithography for the fabrication of masks for DUV and EUV lithography, thus eliminating several problems associated with polymer or organic resist based processes.

SUMMARY OF THE INVENTION

More specifically, the present invention is concerned with a method for fabricating a mask for deep ultra-violet lithography, comprising providing a substrate made of material transparent to deep ultra-violet radiation, depositing on the substrate a layer made of material opaque to deep ultra-violet radiation, depositing on the layer of opaque material two superposed layers including a layer of semiconductor material and a layer of metal capable of reacting with the semiconductor material to form an etch-resistant metal/semiconductor compound, producing a focused electron beam, applying the focused electron beam to the superposed layers of metal and semiconductor material to cause diffusion of metal and semiconductor material in each other and form etch-resistant metal/semiconductor compound, displacing the focused electron beam on the superposed layers of metal and semiconductor material to form a structure of etch-resistant metal/semiconductor compound, and etching the layer of metal, the layer of semiconductor material and the layer of material opaque to deep ultra-violet radiation to leave on the substrate the structure of etch-resistant metal/semiconductor compound and the layer of opaque material underneath that structure to thereby form the mask for deep ultra-violet lithography.

Preferably, the transparent material of the substrate is selected from the group consisting of quartz and glass, the material opaque to deep ultra-violet radiation comprises chromium, the metal is selected from the group consisting of nickel, chromium, copper, palladium and platinum, and the semiconductor material comprises silicon.

The present invention further relates to a method for fabricating a mask for extreme ultra-violet lithography in which a substrate made of extreme ultra-violet reflective material is provided. An extreme ultra-violet absorbent layer is deposited on the substrate. For depositing this extreme ultra-violet absorbent layer, an etch stop sub-layer is deposited on the substrate, a repair buffer sub-layer is deposited on the etch stop sub-layer, and a sub-layer made of extreme ultra-violet radiation absorbent material is deposited on the repair buffer sub-layer. Two superposed layers are then deposited on the extreme ultra-violet absorbent layer, these two superposed layers comprising a layer of semiconductor material and a layer of metal capable of reacting with the semiconductor material to form an etch-resistant metal/semiconductor compound. A focused electron beam is produced and applied to the superposed layers of metal and semiconductor material to cause diffusion of metal and semiconductor material in each other and form etch-resistant metal/semiconductor compound. The focused electron beam is displaced on the superposed layers of metal and semiconductor material to form a structure of etch-resistant metal/ semiconductor compound. The method finally comprises etching the layer of metal, the layer of semiconductor material, the sub-layer made of extreme ultra-violet absorbent material, and the repair buffer sub-layer to leave on the substrate (a) the structure of etch-resistant metal/semiconductor compound and (b) the sub-layer made of extreme ultra-violet absorbent material and the repair buffer sub-layer underneath this structure to thereby form the mask for extreme ultra-violet lithography.

Advantageously, the extreme ultra-violet reflective material of the substrate comprises very thin layers of molybdenum in between very thin layers of silicon, the etch stop sub-layer is made of chromium, the repair buffer sub-layer is made of a material selected from the group consisting of $SiO_2$ and SION, the extreme ultra-violet radiation absorbent material is selected from the group consisting of Ta, W, Cr and TaSi, the semiconductor material comprises silicon, and the metal is selected from the group consisting of nickel, chromium, copper, palladium and platinum.

The objects, advantages and other features of the present invention will become more apparent upon reading of the following non restrictive description of preferred embodiments thereof, given for the purpose of exemplification only with reference to the accompanying drawings.

BRIEF DESCRIPTION OF THE DRAWINGS

In the appended drawings:

FIGS. 1a, 1b, 1c, 1d and 1e illustrate a method to fabricate ultra-small structures of a silicide and how to use them for the fabrication of masks for DUV lithography;

DETAILED DESCRIPTION OF THE PREFERRED EMBODIMENTS

A—SILICIDE FORMATION AT LOW AND HIGH CURRENT DENSITY

Figure 2:
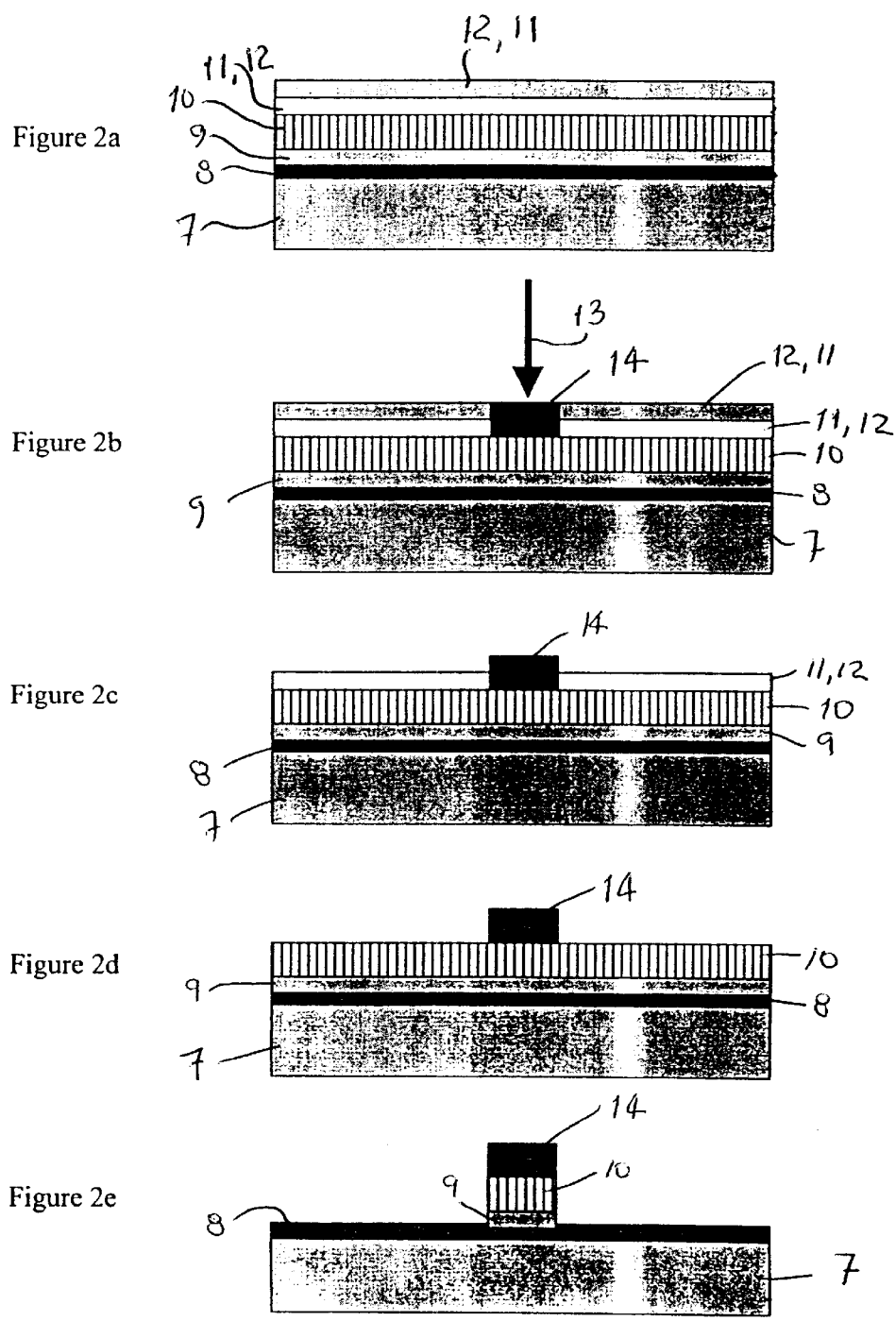
FIGS. 2a, 2b, 2c, 2d and 2e illustrate a method to fabricate ultra-small structures of a silicide and how to use them for the fabrication of masks for EUV lithography.

The preferred embodiments of the invention use a focused electron beam lithography system to pattern silicide structures by annealing these layers of a metal and of silicon. The thin metal and silicon layers are deposited on a sample and the silicide formed can be used as an etch mask for the sample. It was previously believed that the current density must be high enough to reach the temperature necessary for the annealing of the metal layer. However, recent experiments using a defocused electron beam to form a silicide demonstrate that it is also possible to fabricate silicide structures with a current density lower than 100 mA/cm$^2$. In a low current density situation, electrons lose all or most of their energy in a very small volume, near the interface of the metal and silicon layers. Part of the energy is then absorbed at the interface and intermixing of atoms occurs with some metals including nickel, chromium, platinum, palladium and copper, without significant temperature increase. With several electrons losing their energy in the same volume, intermixing results in the formation of silicide, since the activation energy for silicidation is of the order of 1 eV [E. G. Colgan, (1995) J. Mater. Res. 10, 1953].

In higher current density situations, heating caused by the electron beam can be calculated using a standard thermodynamic model [Ralph et al., (1983)]. It has been shown that temperatures greater than 400° C. can be obtained with a focused electron beam such as one found in a scanning electron microscope (SEM) [M. Yasuda, H. Kawata, K. Murata, K. Hashimoto, Y. Harai and N. Nomura, (1994), J. Vac. Sci. Technol., B12, 1362] or an electron beam lithography system. Silicide can be formed easily for several metals at temperatures under 700° C. [S. M. Sze, (1990), Physics of Semiconductor Devices 2nd edition, Willey, N.Y.].

B—FABRICATION OF DUV MASKS

The preferred embodiment of the process for fabricating DUV masks is described by the following steps respectively corresponding to FIGS. 1a, 1b, 1c, 1d and 1e:

FIG. 1a: Deposition of a layer of chromium 1 on a transparent substrate 2 is performed by evaporation or sputtering. The layer of chromium 1 constitute a DUV absorbent layer. Thin layers of silicon 3 and of a metal 4 are then successively deposited on the layer of chromium 1, by evaporation or by sputtering. The metal can be nickel, chromium, copper, palladium, platinum or any other metal that can be used to form a suicide using an electron beam. Alternatively, the process can also be done by inverting the order of deposition of silicon 3 and metal 4 layers. In this case, the etching steps of FIGS. 1c and 1d are also inverted. The transparent substrate 2 can be made of quartz or any kind of glass or material that can be used as a support for DUV masks.

FIG. 1b: Regions of the metal 4 and silicon 3 thin layers are exposed to a focused electron beam 5 from a lithography system. In this process, a silicide is formed over the substrate 2 in the regions exposed to the electron beam 5. The electron beam 5 is displaced and otherwise controlled by a computer to form patterned silicide structures.

FIG. 1c: The sample is immersed in an acid solution that is able to etch the top metal layer 4, leaving the silicide structures 6 intact. Several acids can be used, depending on the chosen metal.

FIG. 1d: The sample is immersed in a second acid solution that is able to etch the silicon thin layer 3, leaving the silicide structures 6 and the chromium layer 1 underneath intact. Usually, a solution of hydrofluoric acid (HF) with peroxide is used to perform this task. Etch of the silicon layer 3 can also be done using a plasma etch. In this case, a fluoro-carbide gas such as $CF_4$ is usually used. Alternatively, a single acid solution can be used to etch both the metal 4 and silicon 3 thin layers.

FIG. 1e: Finally, the sample is immersed in a chromium acid etch solution. The regions of the chromium layer 1 underneath the silicide structures 6 are protected and are not etched. The rest of the chromium layer 1 is completely etched. Usually, a ceric amonium nitrate/perchloric acid solution or chloridric (HCl) acid is used for this purpose.

C—FABRICATION OF EUV MASKS

Fabrication of masks for EUV lithography is illustrated in FIGS. 2a, 2b, 2c, 2d and 2e and the following respectively corresponding steps:

FIG. 2a: A series of layers are deposited on a EUV reflective substrate 7. Such a substrate 7 can be made for example of very thin layers of molybdenum in between very thin layers of silicon. An extreme ultra-violet absorbent layer is first deposited on the substrate 7; this extreme ultra-violet absorbent layer comprises: i) a chromium etch stop sub-layer 8 deposited on the substrate 7; ii) a sub-layer 9 of $SiO_2$, SION, or any material that can be used as a repair buffer deposited on the sub-layer 8; and iii) an absorbent layer 10 made of Ta, W, Cr, TaSi or any other absorbent for EUV light deposited o the sub-layer 9. A thin layer 11 of silicon is deposited on the sub-layer 10, and a thin layer 12 of any metal that is able to form a silicide, such as nickel, chromium, copper, palladium or platinum is deposited on the layer 11 of silicon. These layers and sub-layers can be deposited by evaporation or pulverization or a combination of those. Alternatively, the silicon layer 11 and the metal thin layer 12 can be inverted. In this case, the etching steps c) and d) are also inverted.

FIG. 2b: Regions of the metal 12 and silicon 11 thin layers are exposed to a focused electron beam 13 from a lithography system. In this process, a silicide is formed over the substrate 7 in the regions exposed to the electron beam 13. The electron beam 13 is displaced and otherwise controlled by a computer to form patterned silicide structures 14.

FIG. 2c: The sample is immersed in an acid solution that is able to etch the top metal layer 12, leaving the silicide structures 14 intact. Several acids can be used, depending on the chosen metal.

FIG. 2d: The sample is immersed in a second acid solution that is able to etch the silicon thin layer 11, leaving the silicide structures 14 and the absorbent sub-layer 10 underneath intact. Usually, a solution of hydrofluoric acid (HF) with peroxide is used to perform this task. The etch of the silicon layer 11 can also be done using a plasma etch. In this case, a fluoro-carbide gas such as $CF_4$ is usually used. Alternatively, a single acid solution can be used to etch both the metal 12 and silicon 11 thin layers.

FIG. 2e: A plasma etch of the absorbent sub-layer 10 is performed using a directional etching system down to the etch stop sub-layer 8. For example, with a Ta absorbent sub-layer 10 and a $SiO_2$ repair buffer sub-layer 9 underneath, a $CF_4/O_2$ gas mixture can be used in a reactive ion etcher (RIE) or an electron cyclotron resonance etching system. The regions underneath the silicide structures 14 are protected and remain intact. Alternatively, a non directional plasma etching system or wet etching solution can be used for this purpose.

D—EXAMPLES

The details of the method presented here will emphasize the cases of the fabrication of masks for DUV lithography and EUV lithography. In both cases, the electron beam lithography system used consists of a JEOL JSM-6300 scanning electron microscope (SEM) equipped with a tungsten filament and a beam blanker, externally controlled by the NPGS lithography software. Exposures are carried out at 1.4 keV, with a beam current of 100 pA.

D.1—DUV Mask

Figure 3:
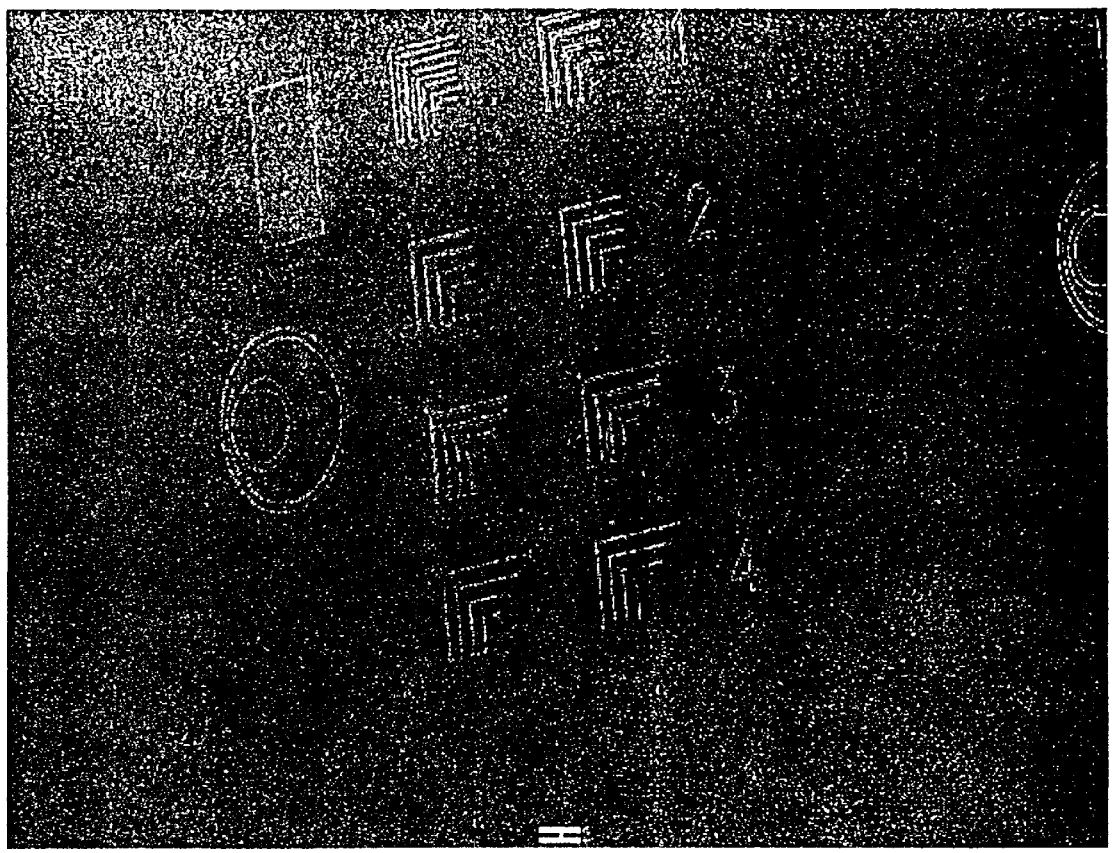
FIG. 3 is a micrograph of elements of a mask for DUV lithography with optical proximity corrections, comprising chromium structures 180 nm thick on a glass substrate and in which the smallest features are 250 nm wide.

On a glass substrate, 180 nm of chromium are evaporated using an electron gun evaporator. A 20 nm thick layer of silicon followed by a 20 nm thick layer of nickel are then evaporated on top of the chromium layer. An electron beam lithography step is done to form silicide patterns as small as 0.25 micrometer. The nickel layer is removed by a nitric acid solution of $H_3PO_4:CH_3CHOHCH_3:H_2O$ in a molar ratio of 5:2:80 at room temperature. The silicon layer is removed by a hydrofluoric acid solution of $HF:H_2O_2:H2O$ in a molar ratio of 5:1:300. The chromium layer is then etched using a standard chromium ceric amonium nitrate/perchloric acid solution. The silicide structures being etch resistant, the chromium regions underneath the silicide structures are protected during the etch. FIG. 3 shows a micrograph of elements of a DUV mask fabricated using this method. The smallest features are less than 250 nm wide.

D.2—EUV Mask

Figure 4:
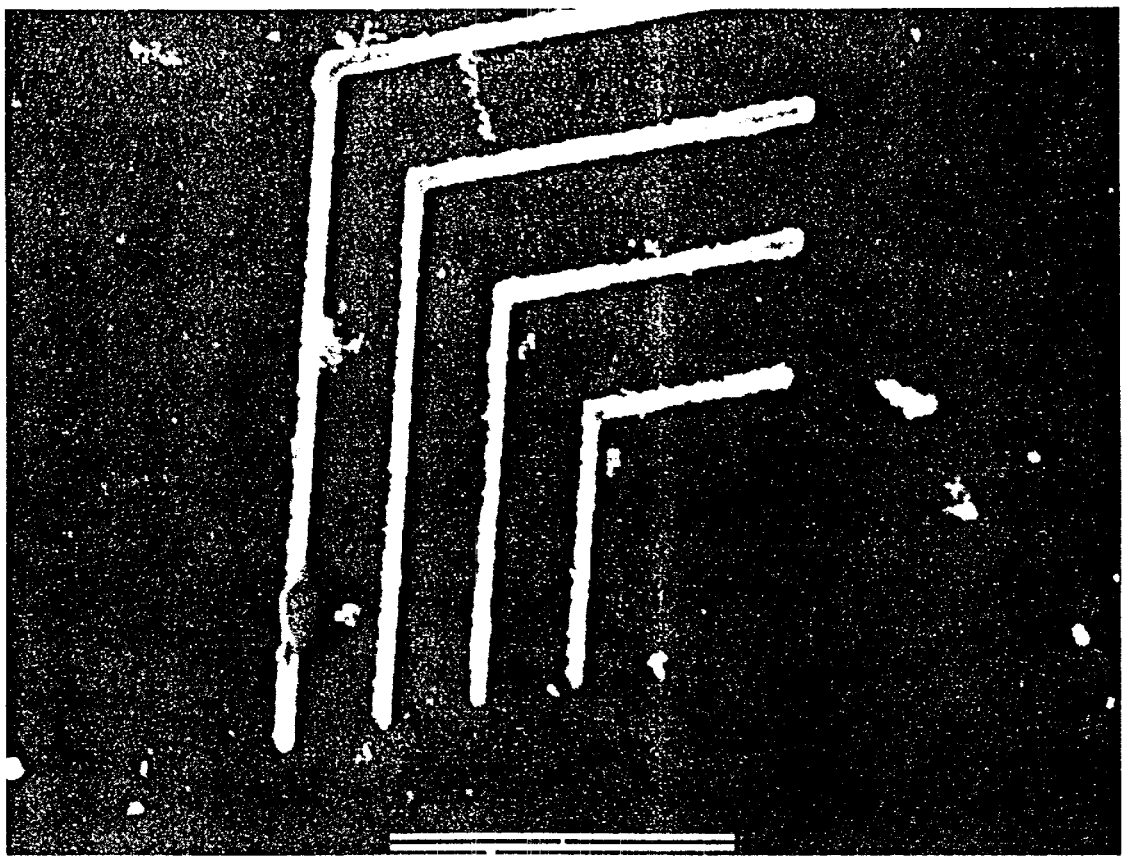
FIG. 4 is a micrograph of elements of a mask for EUV lithography on a Mo/Si reflective substrate, in which the smallest features are 300 nm wide and some defects are present on the mask due to plasma etching in a barrel etcher, a non directional etching process.

The substrate used for the fabrication of a EUV mask consists in a series of thin layers of molybdenum in between layers of silicon. On this substrate is formed an extreme ultra-violet absorbent layer by depositing, through an electron gun evaporator, first a 20 nm thick etch stop sub-layer of chromium, then a 30 nm thick repair buffer sub-layer of $SiO_2$, followed by a 100 nm absorbent sub-layer of tantalum. On top of this are evaporated a 20 nm layer of silicon, followed by a 20 nm layer of chromium. An electron beam lithography step is then performed to form silicide patterns on the sample. The chromium layer is removed by a standard ceric amonium nitrate/perchloric acid solution. The silicon layer is removed by a hydrofluoric acid solution of $HF:H_2O_2:H_2O$ in a molar ratio of 5:1:300. A barrel plasma etcher with a $CF_4/O_2$ gas mixture is used to remove the Ta and the $SiO_2$ sub-layers, except in the regions protected by the silicide structures formed by an electron beam. The barrel etcher is not a directional etching system. FIG. 4 shows a micrograph of elements of such a EUV mask. The smallest features on the mask are 300 nm wide, which with the reduction factor of 10× for EUV mask aligner allows the fabrication of 30 nm wide transistor gates.

In conclusion, the present invention is concerned with a novel method of masks fabrication for DUV and EUV lithography without using polymeric or organic electron sensitive resist. This method takes advantage of a novel direct-write resistless lithography process. This lithography process already demonstrated sub-50 nm resolution with excellent resistance to wet chemical and plasma etching. The resolution attained in the fabrication of DUV and EUV masks is superior to what can be achieved using conventional techniques.

Just a word to mention that, in the process according to the present invention, thin or thick film deposited layers can be used.

Although the present invention has been described hereinabove by way of preferred embodiments thereof, these embodiments can be modified at will, within the scope of the appended claims, without departing from the spirit and nature of the subject invention.

The embodiments of the invention in which an exclusive property or privilege is claimed are defined as follows:

1. A method for fabricating a mask for extreme ultraviolet lithography, comprising:
   providing a substrate made of extreme ultra-violet reflective material;
   depositing on the substrate an extreme ulta-violet absorbent layer, said extreme ultra-violet absorbent layer deposition comprising:
      depositing on the substrate an etch stop sub-layer;
      depositing on the etch stop sub-layer, a repair buffer sub-layer; and
      depositing on the repair buffer sub-layer a sub-layer made of extreme ultra-violet radiation absorbent material;

depositing on the extreme ultra-violet absorbent layer two superposed layers, said two superposed layers comprising a layer of semiconductor material and a layer of metal capable of reacting with the semiconductor material to form an etch-resistant metal/semiconductor compound;

producing a focused electron beam;

applying the focused electron beam to the superposed layers of metal and semiconductor material to cause diffusion of metal and semiconductor material in each other and form etch-resistant metal/semiconductor compound;

displacing the focused electron beam on the superposed layers of metal and semiconductor material to form a structure of etch-resistant metal/semiconductor compound; and etching the layer of metal, the layer of semiconductor material, the sub-layer made of extreme ultra-violet absorbent material, and the repair buffer sub-layer to leave on the substrate (a) the structure of etch-resistant metal/semiconductor compound and (b) the sub-layer made of extreme ultra-violet absorbent material and the repair buffer sub-layer underneath said structure to thereby form said mask for extreme ultra-violet lithography; wherein:

the etch stop sub-layer comprises chromium;

the repair buffer sub-layer comprises a material selected from the group consisting of: $SiO_2$ and SiON; and the extreme ultra-violet radiation absorbent material comprises a material selected from the group consisting of: Ta, W, Cr and TaSi.

2. A method for fabricating a mask for extreme ultra-violet lithography as recited in claim 1, wherein:

the semiconductor material comprises silicon; and the metal is selected from the group consisting of: nickel, chromium, copper, palladium and platinum.

3. A method for fabricating a mask for extreme ultra-violet lithography as recited in claim 1, wherein:

the extreme ultra-violet reflective material of the substrate comprises thin layers of molybdenum in between thin layers of silicon.

* * * * *